(12) United States Patent
Barsun et al.

(10) Patent No.: US 6,909,606 B2
(45) Date of Patent: Jun. 21, 2005

(54) ELECTRONIC DEVICE COOLING SYSTEM AND METHOD OF USE

(75) Inventors: Stephan K. Barsun, Sacramento, CA (US); Thom Augustin, El Dorado Hills, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/637,138

(22) Filed: Aug. 8, 2003

(65) Prior Publication Data

US 2005/0030716 A1 Feb. 10, 2005

(51) Int. Cl.[7] .............................................. H05K 7/20
(52) U.S. Cl. ...................... 361/698; 361/689; 361/694; 361/695; 361/696; 361/699; 174/16.1; 165/104.33; 165/122; 454/184
(58) Field of Search ................................ 361/678, 679, 361/690–696; 174/16.1; 165/80.3, 104.33, 122; 454/184

(56) References Cited

U.S. PATENT DOCUMENTS

| | | | |
|---|---|---|---|
| 5,467,250 A | * 11/1995 | Howard et al. ............. 361/696 |
| 5,918,469 A | 7/1999 | Cardella | |
| 6,082,441 A | * 7/2000 | Boehmer et al. ........... 165/80.3 |
| 6,307,746 B1 | 10/2001 | Beckman | |
| 6,412,292 B2 | * 7/2002 | Spinazzola et al. ............ 62/89 |
| 6,652,373 B2 | * 11/2003 | Sharp et al. ................ 454/184 |
| 6,704,198 B2 | * 3/2004 | Replogle et al. ............ 361/690 |
| 2001/0042616 A1 | * 11/2001 | Baer ........................... 165/299 |
| 2001/0052412 A1 | * 12/2001 | Tikka .......................... 165/299 |
| 2004/0100770 A1 | * 5/2004 | Chu et al. .................... 361/698 |

FOREIGN PATENT DOCUMENTS

| WO | WO 01/72099 A2 | 9/2001 |
|---|---|---|
| WO | WO 2004/049774 A1 | 6/2004 |

* cited by examiner

*Primary Examiner*—Boris Chervinsky

(57) ABSTRACT

An electronic device cooling system includes a heat exchange unit; at least one cooling interface disposed at a heat-transfer interface of an electronic device, where the cooling interface is thermally coupled to the heat exchange unit; and a heat exhaust that is thermally coupled to the heat exchange unit. The heat exhaust exhausts heat from the heat exchange unit to a remote location from the electronic device.

31 Claims, 5 Drawing Sheets

ELECTRONIC DEVICE COOLING SYSTEM AND METHOD OF USE

BACKGROUND

Data, in electronic form, can be used by a vast array of devices for an equally diverse range of applications. Devices that handle electronic data frequently include a processor that processes, manipulates, stores or transmits the electronic data according to programming for that processor.

Examples of typical processor-based devices include computers and servers. In general, a server is a computer that fulfills requests from client programs running on the same or other connected computers. In recent years, computers and servers have become more compact and more cost efficient, while also becoming more powerful.

Processor-based devices, including computers and servers, consume electrical current in their operation. This consumption generates heat inside the device. If this heat is allowed to accumulate, it may result in damage to, or the failure of, the processor-based device by compromising the device's circuitry. Many internal systems have been developed to exhaust the heat from inside these devices to the ambient environment so as to prevent any such heat damage to the internal components of the device.

The Internet, together with the development of more powerful and more economical processors, has broadened the use of, and greatly increased the demand for computers, servers and other processor-based devices. In order to meet this demand, multiple servers are often used together. In order to make efficient use of space, these servers are often placed in server racks. The server racks allow for convenient storage of multiple servers, while still allowing access to individual servers.

One difficulty associated with racks of servers or other processor-based devices is dissipation of the heat generated. Although each server usually utilizes internal cooling systems to remove the internal heat to the ambient environment, with so many racked servers operating and expelling heat in a limited space, the ability to dump internal heat into the ambient environment and so cool the internal components of the device may be compromised by elevated ambient temperatures. As more and more servers are grouped together in server racks, the need for effective removal of internal heat becomes more pronounced.

In response to this need, large cooling systems have been developed to dissipate the heat within a server room, thereby allowing the servers' internal cooling systems to function normally by maintaining a relatively low ambient temperature in the server room into which heat from inside the servers can be dumped. However, these server room cooling systems are often expensive. Moreover, with the need to group servers in a cooled room, the locations where a group of servers can be deployed become restricted by the availability of a cooled room at that location.

SUMMARY

An electronic device cooling system includes a heat exchange unit; at least one cooling interface disposed at a heat-transfer interface of an electronic device, where the cooling interface is thermally coupled to the heat exchange unit; and a heat exhaust that is thermally coupled to the heat exchange unit. The heat exhaust exhausts heat from the heat exchange unit to a remote location from the electronic device.

BRIEF DESCRIPTION OF THE DRAWINGS

The accompanying drawings illustrate various embodiments of the present apparatus and method and are a part of the specification. The illustrated embodiments are merely examples of the present apparatus and method and do not limit the scope of the disclosure.

Throughout the drawings, identical reference numbers designate similar, but not necessarily identical, elements.

DETAILED DESCRIPTION

As described herein, an electronic device cooling system includes at least one cooling interface configured to communicate with at least one heat-transfer interface of an electronic device. The cooling system further includes a heat exhaust configured to fluidly communicate with a location remote from the electronic device.

As used herein, an electronic device shall broadly be understood to be any device that consumes electricity and generates heat. Particular examples of electronic devices include devices that have a processor processing electronic data, such as computers and servers. Further, a heat transfer or cooling interface shall be broadly understood to be any device, apparatus, or part that facilitates heat transfer and/or exchange. In addition, a remote location shall broadly be understood to be any location such that exhausting heat does not substantially affect the temperature of the ambient air around and in the vicinity of the electronic device that is to be maintained at a specified operating temperature or within a specified operating temperature range.

In the following description, for purposes of explanation, numerous specific details are set forth in order to provide a thorough understanding of the present method and apparatus. It will be apparent, however, to one skilled in the art that the present method and apparatus may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Exemplary Structure

Figure 1A:
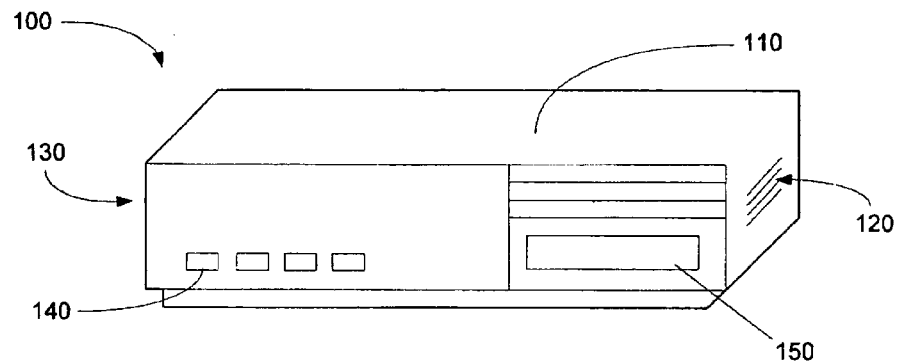
FIG. 1A illustrates perspective view of an electronic device.
Figure 1B:
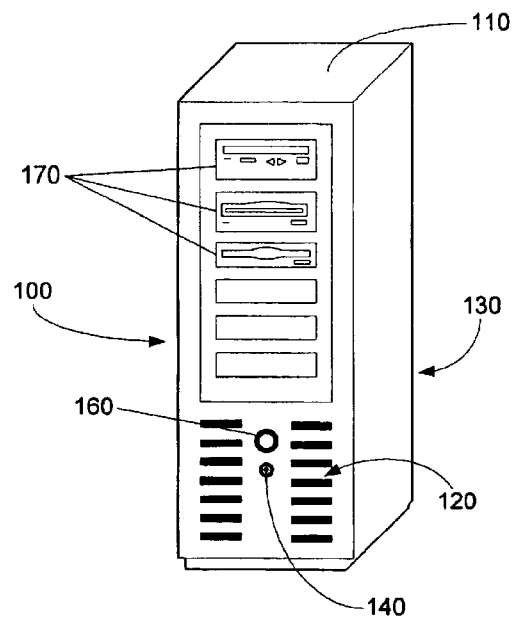
FIG. 1B illustrates a perspective view of an electronic device.

FIGS. 1A and 1B illustrate perspective views of two exemplary electronic devices that are also processor-based devices. The cooling system disclosed herein is intended to be used with, and maintain the operating temperature of, a wide variety of electronic devices including, for example, those pictured in FIGS. 1A and 1B.

As shown in FIGS. 1A and 1B, a typical electronic or processor-based device (100) includes a housing (110) and heat transfer interfaces such as an ambient air intake (120) and a warm air exhaust (130). The devices (109) also typically include status indicators such as lights (140) or a display (150, FIG. 1A) to provide a user with information about the operating status of the device. Additionally, buttons (160, FIG. 1B) or other control devices may be used to control the device (100). These buttons may be, for example, power switches and/or reset buttons.

The processor-based device of FIG. 1A is a server of a type that may be placed in a server rack as described below. In addition, FIG. 1B illustrates an electronic device such as a server or computer which includes disk drives (170) and is configured to readily accept peripherals.

Figure 2:
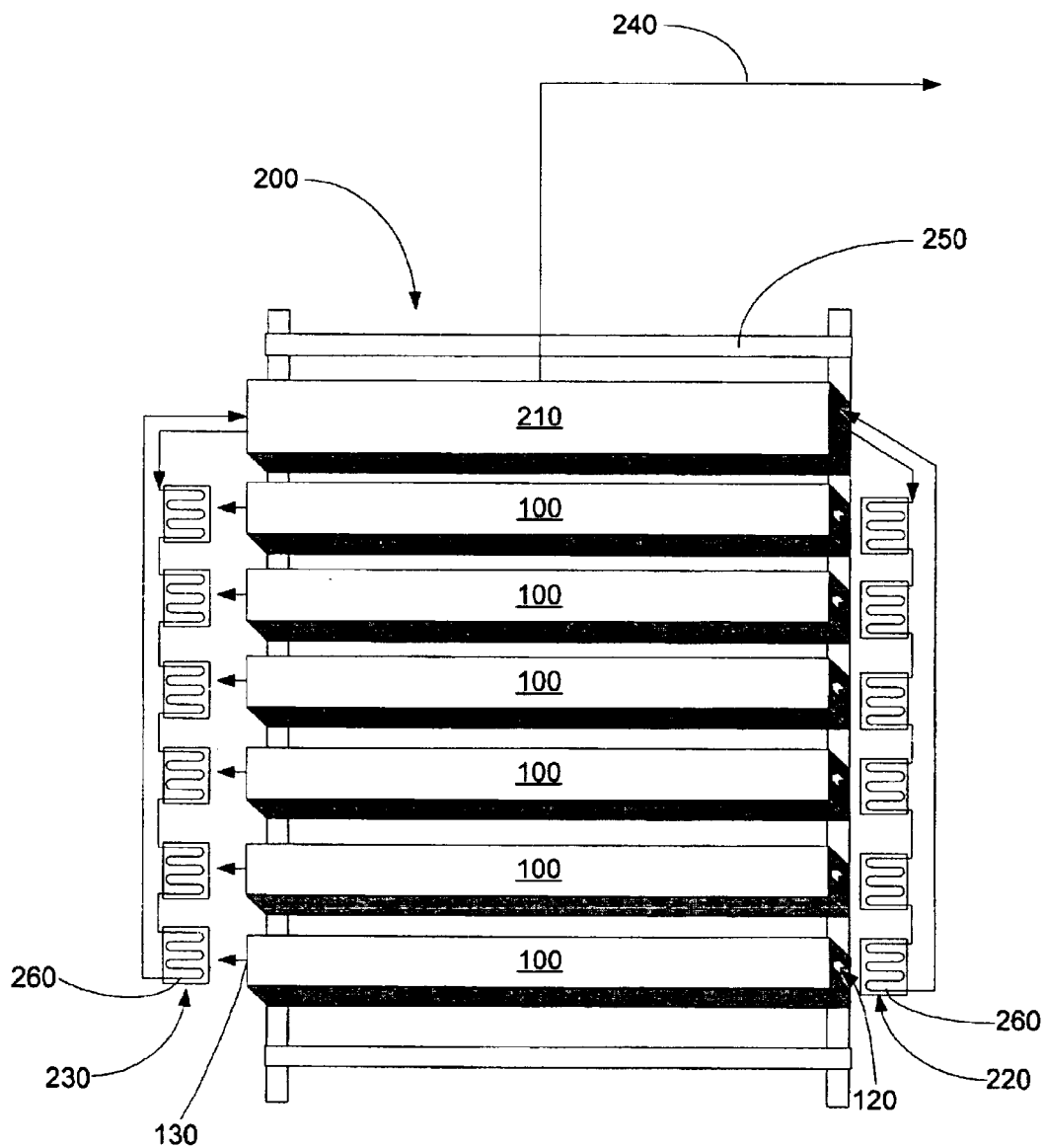
FIG. 2 illustrates an electronic device cooling system according to one exemplary embodiment.

FIG. 2 illustrates a schematic view of the present electronic device cooling system (200). As shown in FIG. 2, the device includes a heat exchange or cooling unit (210), inlet and outlet cooling interfaces (220, 230 respectively), and a remote exhaust (240).

The apparatus (200) is supported by rack (250). Also supported in the rack are processor-based devices (100), such as servers, blades or other computers. The processor-based devices (100) each include a pair of heat-transfer interfaces such as an ambient air inlet (120) and a warm air exhaust (130).

The inlet cooling interfaces (220) of the cooling system (200) are disposed in close proximity with the ambient air inlets (120) of the racked devices (100). The outlet cooling interfaces (230) of the cooling system (200) are in close proximity with the warm air exhausts (130) of the racked devices (100).

In the illustrated implementation, the inlet cooling interfaces (220) and the outlet cooling interfaces (230) include cooling coils (260). A cooled fluid is conveyed from the heat exchange unit (210) to the coils (260). The fluid circulates through the coils (260) and returns to the heat exchange unit (210).

As air passes over the coils (260), heat is removed from the air and transferred to the coils and the fluid flowing through the coils (260). As a result, the air is cooled while the cooling fluid within the coils (260) is warmed. This process will be described in more detail below with reference to FIG. 4.

The warmed cooling fluid is then returned to the heat exchange unit (210). The heat exchange unit (210) removes the accumulated heat from the cooling fluid, thereby cooling the fluid. The cooling fluid is then ready to be re-circulated through the cooling coils to continue the process. The heat accumulated from the cooling interfaces (220, 230) is therefore transferred to the heat exchange unit (210).

This collected heat, as well as any heat generated from operation of the heat exchange unit (210), is transferred to a remote exhaust (240) that removes the heat to a remote location. The remote exhaust (240) may include a vent through which hot air is forced or expelled. Alternatively, the remote exhaust (240) may include a cooling fluid that circulates to transfers heat from the exchange unit (210) to a remote location in a fashion similar to the transfer of heat to the exchange unit (210) through the coils (260).

In some embodiments, the electronic device cooling system (200) is substantially the same width as the processor-based devices (100) such that the electronic device cooling system (200) fits on the rack (250) designed for the processor-based devices (100). Accordingly, the electronic device cooling system (200) may be mounted in or on standard server racks (e.g., 250). Operation of the electronic device cooling system (200) will be discussed in more detail below.

In some embodiments, the cooling system (200) may have only inlet cooling interfaces (220) and not outlet cooling interfaces (230). In some other embodiments, the cooling system (200) may have only outlet cooling interfaces (230) and not inlet cooling interfaces (220).

Exemplary Implementation and Operation

Figure 3:
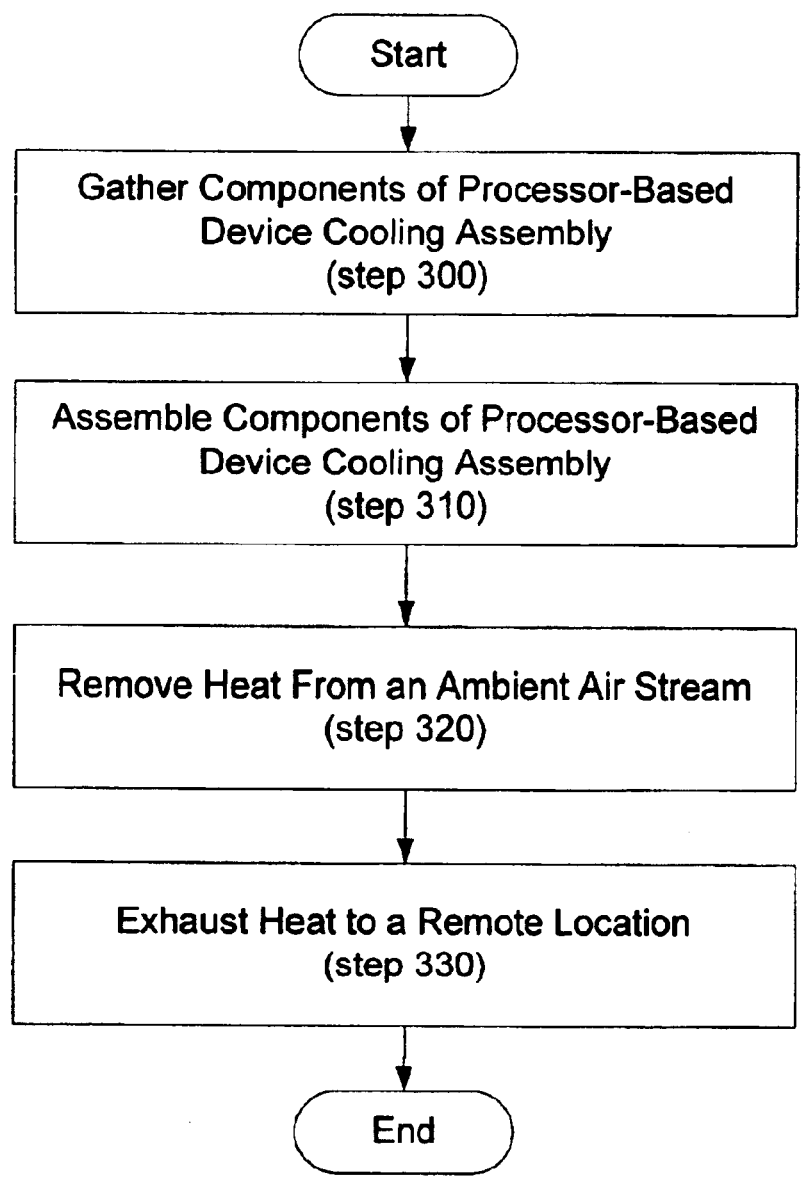
FIG. 3 is a flowchart illustrating a method of cooling an electronic device according to one exemplary embodiment.

FIG. 3 is a flowchart illustrating a method of cooling an electronic device. The method begins by gathering the components of the electronic device cooling assembly (step 300). These components include an electronic device cooling system and at least one electronic device, such as a processor-based device. The cooling system includes inlet and outlet cooling interfaces a heat-transfer mechanism, and a remote exhaust. The processor-based device includes heat transfer interfaces such as, by way of example, an ambient air inlet and a warm air exhaust.

The components are then assembled (step 310) by installing the electronic device cooling system and the processor-based device on a rack. In some embodiments, the process-based device may already be in place in the rack and the assembly includes merely the installation of the cooling system on the rack. In other embodiments, the processor-based device or device may not be supported by rack, but by some other arrangement or device.

The assembling step further includes thermally coupling the electronic device cooling system to the processor-based device. This coupling step includes thermally coupling at least one cooling interface of the cooling system to at least one of the heat transfer interfaces of the processor-based devices. The cooling interfaces of the cooling system may include inlet and/or outlet cooling interfaces while the heat transfer interfaces of the processor-based device may include ambient air inlets and/or warm air exhausts. Further, the cooling interfaces of the cooling system may be coupled to both the ambient air inlets and the warm air exhausts of the processor-based device.

Heat is then withdrawn from an air stream through the processor-based device or devices (320). For example, an air stream entering the processor-based devices, i.e., entering an ambient air inlet (120, FIG. 2), is cooled by the transferring heat to the cooling system through, for example, the inlet cooling interface (220, FIG. 2). Thus, the air taken into the processor-based device is cooler than the ambient air in the general vicinity of the processor-based device. Additionally, as heated air is expelled from the processor-based device through warm air exhaust (130, FIG. 2), that air is cooled by the outlet cooling interface (230, FIG. 2) of the cooling system. Thus, less heat is introduced into the ambient environment of the processor-based device.

Thus, the cooling of the system may be done directly or indirectly. Direct cooling may be accomplished by flowing the air stream over the cooling interfaces prior to intake by the processor-based device. Indirect cooling may be accomplished by removing the heat from a warm air stream leaving the processor-based device which results in a lower temperature of the ambient air.

In either case, the heat removed from the air stream is then exhausted to a remote location (step 330). Accordingly, the cooling system can facilitate the cooling of multiple processor-based devices using a unit located in the same rack as the devices being cooled.

The use of a cooling system that is located in the same rack as the processor-based devices minimizes the need for expensive large-scale cooling systems. Thus may reduce costs, which may make the use of multiple processor-based devices more accessible to a larger number of consumers.

Figure 4:
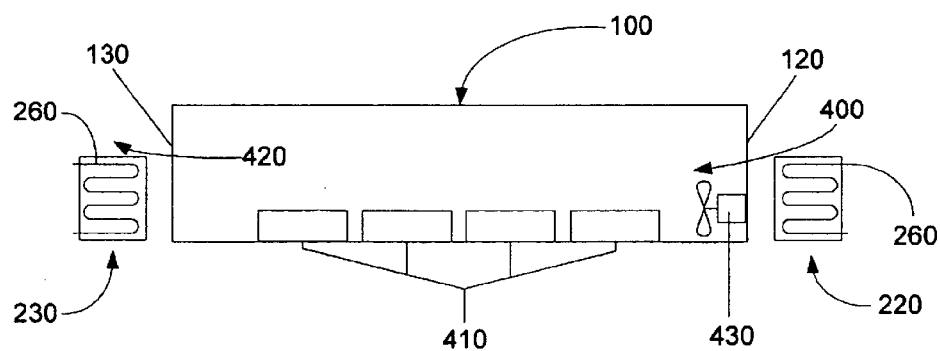
FIG. 4 illustrates a partial schematic of electronic device coupled to an electronic device cooling system according to one exemplary embodiment.

FIG. 4 illustrates a partial cross-section view of an electronic device, such as a processor-based device (100), cooled by the cooling system (200) of FIG. 2. When the processor-based device (100) is in operation, an ambient air stream (400) is drawn through the ambient air inlets (120) into the processor-based device (100). There, the ambient air stream (400) flows over heated internal components (410) of the processor-based device (100).

The internal components (410) are thus cooled by convection due to the difference in temperature between the ambient air (400) and the internal components (410). The convection may be forced or unforced. Thus, as the ambient air stream (400) passes over the heated internal components, the ambient air stream (400) is heated and transformed into a warm air exhaust stream (420) which flows out of the processor-based device (100) through warm air exhaust (130).

As mentioned, the convection cooling inside processor-based device (100) may be forced or unforced. Forced convection may be accomplished by the use of a fan (430). Any number of fans (430) may be used in any combination to achieve the desired forced convection.

The effectiveness of the ambient air stream (400) in cooling the internal components (310) is dependent on the amount of heat in the ambient air stream (400) as it enters the processor-based device (100). The amount of heat in the ambient air stream (400) may be directly controlled as the ambient air stream (400) enters the processor-based device (100), or it may be indirectly controlled as the warm air stream (420) exits the warm air exhaust (130).

For example, the ambient air stream (400) may be cooled by passing over the cooling coils (260) of the inlet cooling interface (220), thereby directly affecting the temperature of the ambient air stream (400) as it enters the processor-based device (100). Similarly, the warm air exhaust stream (420) may be cooled by passing over the cooling coils (260) of the outlet cooling interface (230), thereby indirectly affecting the amount of heat in the ambient air stream. Accordingly, less heat enters the ambient air from the warm air stream (420) because heat is absorbed by the outlet cooling interface (230). Thus, the ambient air stream (400), which is at the temperature of the ambient air, is indirectly controlled by the outlet cooling interface (230).

The heat from the cooling interfaces (220, 230) is transferred to the heat exchange unit (210, FIG. 2). The heat exchange unit (210, FIG. 2) in turn transfers this heat, and the heat generated by the operation of the heat exchange unit (210, FIG. 2), to the remote exhaust (240, FIG. 2).

Figure 5:
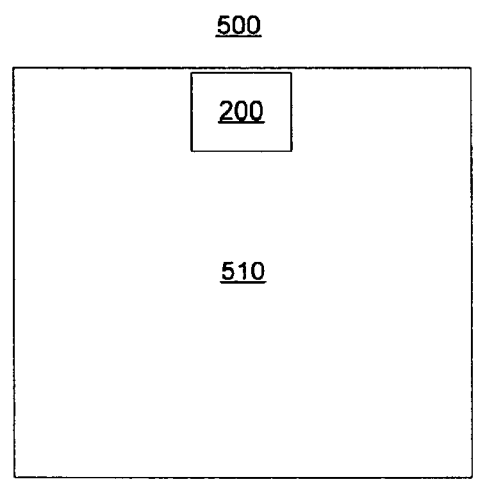
FIG. 5 illustrates a schematic of an electronic device cooling assembly according to one exemplary embodiment.

As shown in FIG. 5, the remote exhaust (240, FIG. 2) then removes the heat to a remote location (500). The remote location (500) is remote enough from the cooling system (200) and the devices (100, FIG. 2) being cooled that the temperature of the ambient air is substantially unaffected by the exhausted heat.

In the illustrated implementation, the remote location (500) is outside of a room (510) where the cooling system (200) is located. Accordingly, the cooling system (200) may be located within a standard server rack and may dissipate heat from processor-based devices (100, FIG. 2) without the need for systems to cool an entire room (e.g., 510).

Alternative Embodiments

Figure 6:
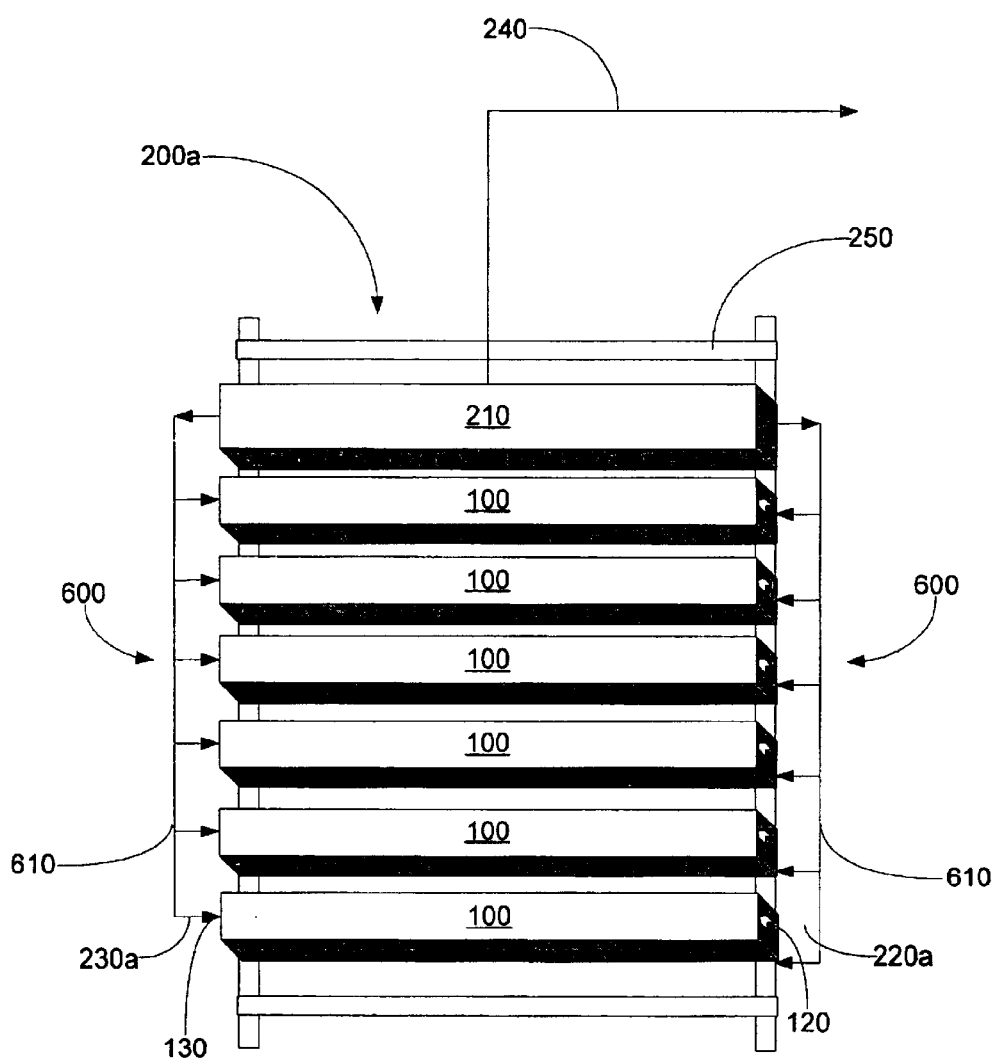
FIG. 6 illustrates an electronic device cooling system according to one exemplary embodiment.

FIG. 6 illustrates a schematic view of a cooling system (200a) that makes use of air ducts (600), rather than cooling coils (260, FIG. 2). The air ducts (600) connect the cooling or heat exchange unit (210) with cooling interfaces (220a, 230a) at the devices being cooled.

In this configuration, air is cooled by the heat exchange unit (210) and blown through conduits (610) to the cooling interfaces (220a, 230a). The inlet cooling interface (220a) directs the cooled air into the ambient air inlet (120). This direct cooling of the processor-based device (100) may improve the efficiency of the cooling system (200a) by providing more direct cooling to the internal components (410, FIG. 4).

Similarly, the outlet cooling interface (230a) may direct cooled air to the warm air exhaust (130). This will decrease the amount of heat that remains in the ambient environment of the processor-based device (100).

Those of skill in the art will appreciate that any combination of air ducts (600) and/or cooling coils (260, FIG. 2) may be used to directly and/or indirectly cool the ambient air stream (400, FIG. 4) and/or the internal components (410, FIG. 4). In addition, any number of cooling systems (200, 200a) may be combined with any number of processor-based devices (100) or other heat generating devices (not shown).

In another embodiment, not shown, the cooling electronic device cooling system is coupled to cooling loops disposed within an electronic device. In this embodiment, the electronic device, and the cooling mechanism are all contained on the same rack. Further, the cooling loops include fluid couplings that facilitate disconnection of the electronic device for servicing.

While some of the electronic devices discussed above are processor-based devices, those of skill in the art will appreciate that the present apparatus and method may be used with any electronic device or any combination of electronic devices.

The preceding description has been presented only to illustrate and describe the present method and apparatus. It is not intended to be exhaustive or to limit the disclosure to any precise form disclosed. Many modifications and variations are possible in light of the above teaching. It is intended that the scope of the invention be defined by the following claims.

What is claimed is:

1. An electronic device cooling apparatus, comprising:
    a heat exchange unit configured to deliver cooled air through a cool air conduit to a plurality of cooling interfaces in said cool air conduit; and
    said plurality of cooling interfaces each disposed at a heat-transfer interface of an electronic device and delivering said cooled air to said heat-transfer interface of said electronic device.

2. The apparatus of claim 1, wherein said electronic device further comprises a plurality of heat-transfer interfaces wherein said heat-transfer interfaces include an ambient air inlet and a warm air outlet.

3. The apparatus of claim 2, wherein one of said cooling interfaces is disposed at said ambient air inlet.

4. The apparatus of claim 2, wherein one of said cooling interfaces is disposed at said warm air outlet.

5. The apparatus of claim 2, wherein a first cooling interface is disposed at said ambient air inlet of said electronic device, and a second cooling interface is disposed at said warm air outlet of said electronic device.

6. The apparatus of claim 1, wherein said heat exchange unit is further configured to deliver a liquid coolant to cooling coils disposed in at least some of said cooling interfaces.

7. The apparatus of claim 6,
    wherein said electronic device further comprises a plurality of heat-transfer interfaces including an ambient air inlet and a warm air outlet;

wherein a first cooling interface is disposed at said ambient air inlet of said electronic device, and a second cooling interface is disposed at said warm air outlet of said electronic device; and wherein said first cooling interface comprises a cool air conduit and said second cooling interface comprises cooling coils.

8. The apparatus of claim 6, wherein said electronic device further comprises a plurality of heat-transfer interfaces including an ambient air inlet and a warm air outlet;

wherein a first cooling interface is disposed at said ambient air inlet of said electronic device, and a second cooling interface is disposed at said warm air outlet of said electronic device; and wherein said first cooling interface comprises cooling coils and said second cooling interfaces comprises a cool air conduit.

9. The apparatus of claim 5, wherein said first and second cooling interfaces are disposed within said electronic device.

10. The apparatus of claim 1, further comprising a support structure wherein said electronic device and said cooling device are configured to be commonly supported by said support structure.

11. The apparatus of claim 10, wherein said support structure comprises a server rack.

12. The apparatus of claim 1, wherein said electronic device is a server.

13. An cooling system for electronic devices, comprising:
a plurality of cooling interfaces; and
a heat exchange unit configured to deliver cooled air to at least a first cooling interface; and liquid coolant to at least a second cooling interface;
wherein each of said cooling interfaces is disposed at a heat-transfer interface of an electronic device.

14. The system of claim 13, wherein said electronic device further comprises a plurality of heat-transfer interfaces wherein said heat-transfer interfaces include an ambient air inlet and a warm air outlet.

15. The system of claim 14, wherein one of said cooling interfaces is disposed at said ambient air inlet.

16. The system of claim 14, wherein one of said cooling interfaces is disposed at said warm air outlet.

17. The system of claim 13, wherein said first cooling interface is disposed at an ambient air inlet of said electronic device, and said second cooling interface is disposed at a warm air outlet of said electronic device.

18. The system of claim 13, wherein said second cooling interface is disposed at an ambient air inlet of said electronic device, and said first cooling interface is disposed at a warm air outlet of said electronic device.

19. The system of claim 13, wherein said first and second cooling interfaces are disposed within said electronic device.

20. The system of claim 13, further comprising a support structure wherein said electronic device and said cooling system are configured to be commonly supported by said support structure.

21. The system of claim 20, wherein said support structure comprises a server rack.

22. A method of cooling electronic devices comprising delivering cooled air from a heat exchange unit through a cool air conduit to a plurality of cooling interfaces in said cool air conduit, wherein each of said cooling interfaces is disposed at a heat-transfer interface of an electronic device.

23. The method of claim 22, wherein said electronic device further comprises a plurality of heat-transfer interfaces including an ambient air inlet and a warm air outlet, said method further comprising delivering cooled air to a cooling interface located at each of said inlet and said outlet.

24. The method of claim 22, further comprising delivering a liquid coolant to cooling coils disposed in at least some of said cooling interfaces.

25. The method of claim 24, wherein said electronic device further comprises a plurality of heat-transfer interfaces including an ambient air inlet and a warm air outlet, said method further comprising delivering cooled air to a cooling interface located at said inlet and delivering coolant a cooling interface located at said outlet.

26. The method of claim 24, wherein said electronic device further comprises a plurality of heat-transfer interfaces including an ambient air inlet and a warm air outlet, said method further comprising delivering cooled air to a cooling interface located at said outlet and delivering coolant a cooling interface located at said inlet.

27. A method of cooling electronic devices comprising:
delivering cooled air to at least a first cooling interface; and
delivering liquid coolant to at least a second cooling interface;
wherein each of said cooling interfaces is disposed at a heat-transfer interface of an electronic device.

28. The method of claim 27, wherein said electronic device further comprises a plurality of heat-transfer interfaces including an ambient air inlet and a warm air outlet, said method further comprising delivering cooled air to a cooling interface located at said inlet and delivering coolant a cooling interface located at said outlet.

29. The method of claim 27, wherein said electronic device further comprises a plurality of heat-transfer interfaces including an ambient air inlet and a warm air outlet, said method further comprising delivering cooled air to a cooling interface located at said outlet and delivering coolant a cooling interface located at said inlet.

30. A system for cooling electronic devices comprising:
means for cooling air; and
means for delivering cooled air to a plurality of cooling interfaces,
wherein each of said cooling interfaces is disposed at a heat-transfer interface of an electronic device.

31. A system for cooling electronic devices comprising:
means for delivering cooled air to at least a first cooling interface; and
means for delivering liquid coolant to at least a second cooling interface;
wherein each of said cooling interfaces is disposed at a heat-transfer interface of an electronic device.

* * * * *